(12) United States Patent
Sakai et al.

(10) Patent No.: US 12,167,697 B2
(45) Date of Patent: Dec. 10, 2024

(54) PIEZOELECTRIC ELEMENT, PIEZOELECTRIC ELEMENT APPLICATION DEVICE

(71) Applicant: Seiko Epson Corporation, Tokyo (JP)

(72) Inventors: Tomohiro Sakai, Matsumoto (JP); Yasuaki Hamada, Chino (JP)

(73) Assignee: SEIKO EPSON CORPORATION (JP)

( * ) Notice: Subject to any disclaimer, the term of this patent is extended or adjusted under 35 U.S.C. 154(b) by 764 days.

(21) Appl. No.: 17/348,823

(22) Filed: Jun. 16, 2021

(65) Prior Publication Data
US 2021/0399205 A1 Dec. 23, 2021

(30) Foreign Application Priority Data
Jun. 17, 2020 (JP) .................. 2020-104349

(51) Int. Cl.
*H01L 41/187* (2006.01)
*H10N 30/00* (2023.01)
*H10N 30/078* (2023.01)
*H10N 30/079* (2023.01)
*H10N 30/853* (2023.01)

(52) U.S. Cl.
CPC ....... *H10N 30/8542* (2023.02); *H10N 30/078* (2023.02); *H10N 30/079* (2023.02); *H10N 30/708* (2024.05)

(58) Field of Classification Search
CPC ... H10N 30/8542; H10N 30/85; H01N 30/853
See application file for complete search history.

(56) References Cited

U.S. PATENT DOCUMENTS

| | | | |
|---|---|---|---|
| 2007/0278904 A1 | 12/2007 | Shibata et al. | |
| 2009/0075066 A1 | 3/2009 | Shibata et al. | |
| 2009/0096328 A1 | 4/2009 | Shibata et al. | |
| 2011/0006643 A1 | 1/2011 | Shibata et al. | |
| 2012/0229953 A1 | 9/2012 | Hatano et al. | |
| 2013/0106242 A1* | 5/2013 | Shibata ............ | H10N 30/2042 428/471 |
| 2013/0127293 A1* | 5/2013 | Ikeuchi ............ | H10N 30/079 204/192.1 |
| 2013/0187516 A1* | 7/2013 | Suenaga ........... | H10N 30/877 310/360 |

(Continued)

FOREIGN PATENT DOCUMENTS

| | | |
|---|---|---|
| JP | 2007-320840 A | 12/2007 |
| JP | 2009-094449 A | 4/2009 |

(Continued)

*Primary Examiner* — Bryan P Gordon
(74) *Attorney, Agent, or Firm* — Harness, Dickey & Pierce, P.L.C.

(57) ABSTRACT

A piezoelectric element 1 includes a first electrode 20, a second electrode 40, and a piezoelectric layer 30 provided between the first electrode 20 and the second electrode 40. The piezoelectric layer 30 is composed of a composite oxide having a perovskite-type structure and containing potassium (K), sodium (Na), and niobium (Nb), and has a first peak derived from a (100) plane, a second peak derived from a (010) plane, and a third peak derived from a (001) plane in an X-ray diffraction pattern obtained by θ-2θ measurement.

4 Claims, 4 Drawing Sheets

(56) References Cited

U.S. PATENT DOCUMENTS

| | | | |
|---|---|---|---|
| 2014/0145555 A1* | 5/2014 | Kurachi | A61B 5/02444 |
| | | | 310/311 |
| 2016/0276572 A1 | 9/2016 | Sumi et al. | |
| 2018/0138393 A1 | 5/2018 | Sumi et al. | |

FOREIGN PATENT DOCUMENTS

| | | |
|---|---|---|
| JP | 2009-117785 A | 5/2009 |
| JP | 2011-035370 A | 2/2011 |
| JP | 2013-149922 A | 8/2013 |
| JP | 2014-042047 A | 3/2014 |
| JP | 2016-178253 A | 10/2016 |
| JP | 2017-050353 A | 3/2017 |
| JP | 2018-082052 A | 5/2018 |

* cited by examiner

PIEZOELECTRIC ELEMENT, PIEZOELECTRIC ELEMENT APPLICATION DEVICE

The present application is based on, and claims priority from JP Application Serial Number 2020-104349, filed Jun. 17, 2020, the disclosure of which is hereby incorporated by reference herein in its entirety.

BACKGROUND

1. Technical Field

The present disclosure relates to a piezoelectric element and a piezoelectric element application device using the piezoelectric element.

2. Related Art

JP-A-2011-035370 describes a piezoelectric thin film element using potassium sodium niobate as a material for a piezoelectric layer as one of the piezoelectric elements. Further, in JP-A-2011-035370, it is preferable that a crystal structure of the piezoelectric thin film represented by $(K_{1-x}Na_x)NbO_3$ $(0<x<1)$ is a phase boundary state of a pseudo-cubic crystal and an orthorhombic crystal.

However, in the piezoelectric thin film element described in JP-A-2011-035370, when the crystal structure of the piezoelectric thin film is close to a pseudocubic crystal, it is difficult to show a large structural displacement because the shape is close to a cubic crystal that does not show ferroelectricity. That is, as a piezoelectric element using potassium sodium niobate as a material for the piezoelectric layer, further improvement in a piezoelectric characteristic is required.

SUMMARY

A piezoelectric element according to the present disclosure includes: a first electrode; a second electrode; and a piezoelectric layer provided between the first electrode and the second electrode, in which the piezoelectric layer is composed of a composite oxide having a perovskite-type structure and containing potassium, sodium, and niobium, and has a first peak derived from a (100) plane, a second peak derived from a (010) plane, and a third peak derived from a (001) plane in an X-ray diffraction pattern obtained by θ-2θ measurement.

A piezoelectric element application device according to the present disclosure includes the piezoelectric element.

DESCRIPTION OF EXEMPLARY EMBODIMENTS

Figure 1:
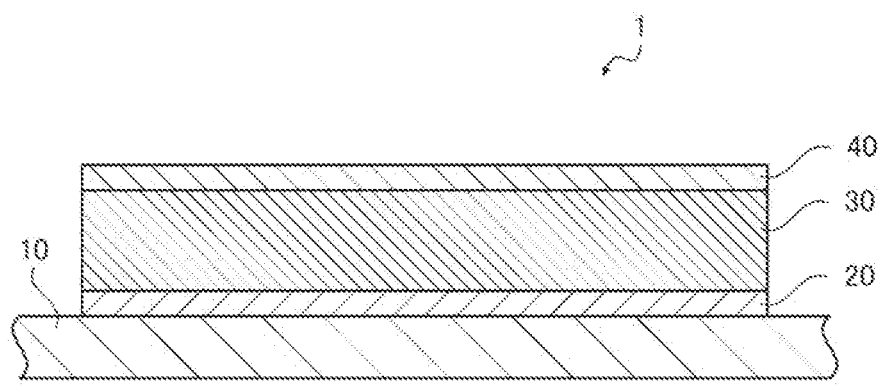
FIG. 1 is a cross-sectional view schematically showing a piezoelectric element according to an embodiment of the present disclosure.

A configuration of a piezoelectric element 1 according to an embodiment will be described with reference to FIG. 1.

The piezoelectric element 1 includes a substrate 10, a first electrode 20 formed on the substrate 10, a piezoelectric layer 30 formed on the first electrode 20, and a second electrode 40 formed on the piezoelectric layer 30. That is, the piezoelectric element 1 includes the first electrode 20, the second electrode 40, and the piezoelectric layer 30 provided between the first electrode 20 and the second electrode 40.

In the description, an upward direction indicates a direction in which layers are laminated on the substrate 10. That is, the upward direction does not specify an orientation when the piezoelectric element 1 is used.

The substrate 10 is selected according to the application of the piezoelectric element 1, and a material and a configuration of the substrate 10 are not particularly limited. As the substrate 10, an insulating substrate, a semiconductor substrate, or the like can be used. As the insulating substrate, for example, a sapphire substrate, an STO substrate, a plastic substrate, a glass substrate can be used, and as the semiconductor substrate, a silicon substrate or the like can be used. Further, the substrate 10 may be a single substrate or a laminate in which another layer is laminated on the substrate. STO means $SrTiO_3$.

Figure 2:
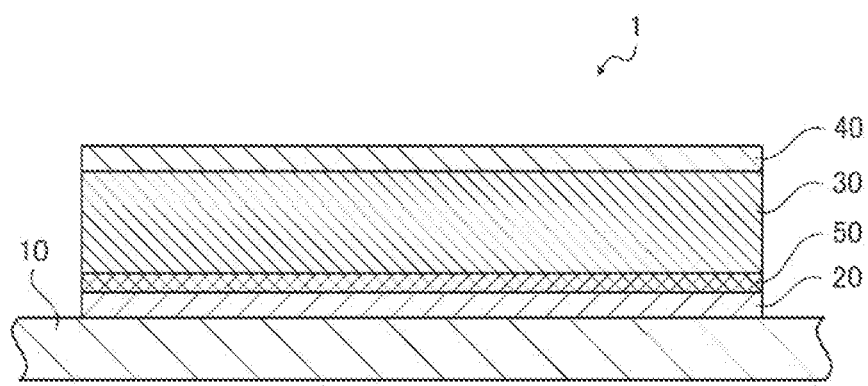
FIG. 2 is a cross-sectional view schematically showing a modification example of the piezoelectric element according to the embodiment of the present disclosure.

As the first electrode 20, a conductive layer having a multilayer structure, in which a metal layer such as a platinum group and a conductive composite oxide layer are laminated, can be used. An uppermost layer of the first electrode 20 is configured to function as a seed layer that controls a crystal orientation of the piezoelectric layer 30 that is the upper layer thereof. Alternatively, as shown in FIG. 2, an orientation control layer 50 may be provided on the first electrode 20. In this case, the first electrode 20 may be a single layer of a metal layer or a conductive composite oxide layer.

The uppermost layer of the first electrode 20 and the orientation control layer 50 are provided as a structure having the same crystal structure as the piezoelectric layer 30, and are configured such that the piezoelectric layer 30 has a crystal structure that inherits a crystal structure of these seed layers.

As the orientation control layer 50, for example, a perovskite-type oxide having a film thickness of 50 to 100 nm, such as nickel lanthanate ($LaNiO_3$), can be used.

The piezoelectric layer 30 is composed of a composite oxide having a perovskite-type structure and containing potassium (K), sodium (Na) and niobium (Nb). Further, the piezoelectric layer 30 preferably contains manganese (Mn).

Specifically, the piezoelectric layer 30 is formed by laminating, for example, 11 layers of thin films having a composition of K/Na/Nb/Mn=50.2/50.2/99.5/0.5 and a thickness of 30 nm.

Further, the piezoelectric layer 30 has a first peak derived from a (100) plane, a second peak derived from a (010) plane, and a third peak derived from a (001) plane in an X-ray diffraction pattern obtained by θ-2θ measurement.

The second electrode 40 can be composed of a metal layer or a conductive composite oxide layer. The second electrode 40 may be a laminate of a metal layer and a conductive composite oxide layer. As a material of the second electrode 40, a metal layer such as platinum, iridium, and aluminum or a conductive composite oxide layer such as iridium oxide can be used.

Next, an example of a method of forming the piezoelectric element 1 will be described.

First, the substrate 10 is prepared. The substrate 10 is selected depending on the purpose of the piezoelectric element 1 as described above. As the substrate 10, for example, an STO substrate, an Nb-doped STO substrate, or a sapphire substrate can be used.

As shown in FIG. 2, when the orientation control layer 50 is provided on the first electrode 20, the orientation control layer 50 is formed at the first electrode 20. When nickel lanthanate is used as the orientation control layer 50, for example, a sputtering method can be used.

Next, as shown in FIG. 1, the piezoelectric layer 30 represented by the above composition formula is formed on the first electrode 20 or on the orientation control layer 50.

Specifically, first, a precursor solution which is a material for forming the piezoelectric layer 30 is prepared so as to have the composition of the above composition formula.

The precursor solution can be prepared by mixing organometallic compounds containing metals composing the piezoelectric material that forms the piezoelectric layer 30, such that the metals have a desired molar ratio, and by dissolving or dispersing the organometallic compounds with an organic solvent such as alcohol. As the organometallic compounds containing metals composing the piezoelectric material, organometallic compounds such as a metal alkoxide or an organic acid salt, and a β-diketone complex can be used.

Various additives such as stabilizers can be added to the precursor solution, if necessary. Further, when the precursor solution is hydrolyzed or polycondensed, an acid or a base as a catalyst can be added to the precursor solution together with an appropriate amount of water.

Next, one layer of the prepared precursor solution is applied onto the first electrode 20 by a spin coating method such that the piezoelectric layer 30 has a desired composition ratio.

Next, heat treatment is applied to crystallize the applied precursor solution. Specifically, as a heat treatment process, after performing a drying treatment at 180° C. and a degreasing treatment at 380° C., a firing treatment at 700° C. exceeding the Curie temperature is performed. After that, the temperature is returned to the room temperature to complete the crystallization of the first layer.

Next, for the second layer to the eleventh layer, the process of applying the precursor solution by the spin coating method to the process of applying heat treatment to crystallize the coated layer and returning the temperature to the room temperature are similarly repeated to form the piezoelectric layer 30. Therefore, the piezoelectric layer 30 is formed by the solution method.

Next, as shown in FIG. 1, the second electrode 40 is formed on the piezoelectric layer 30. The metal layer or the conductive composite oxide layer forming the second electrode 40 is formed by, for example, a known method such as sputtering.

Next, if necessary, post-annealing treatment is performed to improve crystallinity of an interface between the second electrode 40 and the piezoelectric layer 30 and crystallinity of the piezoelectric layer 30.

The piezoelectric element 1 can be formed by the above processes.

A piezoelectric layer composed of a composite oxide having a perovskite-type structure and containing potassium (K), sodium (Na) and niobium (Nb) is easily oriented to the (100) plane, but the piezoelectric layer 30 of the present embodiment has the first peak derived from the (100) plane, the second peak derived from the (010) plane, and the third peak derived from the (001) plane in the X-ray diffraction pattern obtained by θ-2θ measurement. That is, the piezoelectric layer 30 is formed with three states including a crystal state corresponding to the (100) plane, a crystal state corresponding to the (010) plane, and a crystal state corresponding to the (001) plane. In the piezoelectric layer 30 formed by the solution method, a structure including these three states is formed by a stress generated in a forming stage. These three states exist as a cubic crystal in a temperature range above the Curie temperature, and when the temperature decreases below the Curie point, the structure becomes one of these three states depending on a state of stress balance during temperature decreasing. That is, it is possible to generate these three states by generating a state in which the stress is non-uniform near the Curie temperature. Examples of a method of creating a state in which the stress is non-uniform include a method of having a distribution in film thickness of a piezoelectric layer or an electrode, and a method of controlling a grain shape of a piezoelectric body. Therefore, although a manufacturing specification is not specified by the method of preparing the piezoelectric body, it is desirable to determine the manufacturing specification for generating these three states based on sufficient evaluation.

Figure 3:
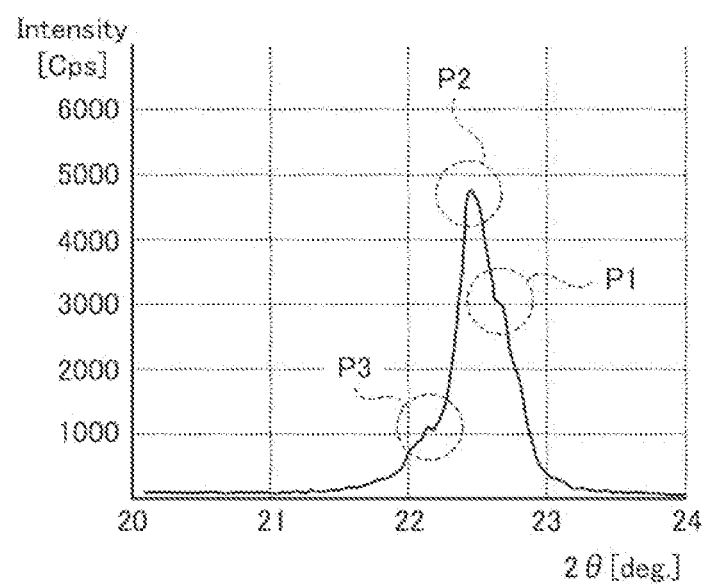
FIG. 3 is a graph showing an X-ray diffraction result obtained by θ-2θ measurement of the piezoelectric element according to the embodiment of the present disclosure.

FIG. 3 is a graph showing an X-ray diffraction result obtained by θ-2θ measurement of the piezoelectric layer 30. In FIG. 3, a horizontal axis represents a value of 2θ, and a vertical axis represents an X-ray diffraction intensity.

As shown in FIG. 3, in a range of 22°<2θ<23°, a first peak P1 derived from the (100) plane, a second peak P2 derived from the (010) plane, and a third peak P3 derived from the (001) plane are recognized.

Further, an X-ray diffraction intensity of the first peak P1 is larger than an X-ray diffraction intensity of the third peak P3. That is, in the piezoelectric layer 30, the crystal state corresponding to the (100) plane is included more than the crystal state corresponding to the (001) plane.

Figure 4:
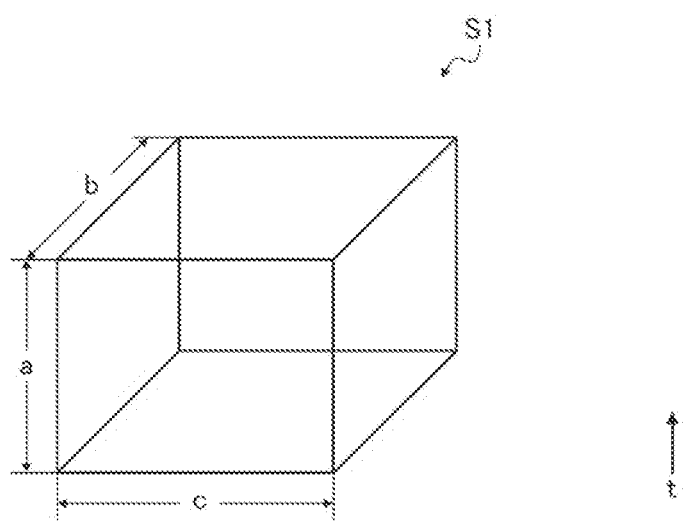
FIG. 4 is a perspective view schematically showing a crystal state corresponding to a (100) plane.
Figure 5:
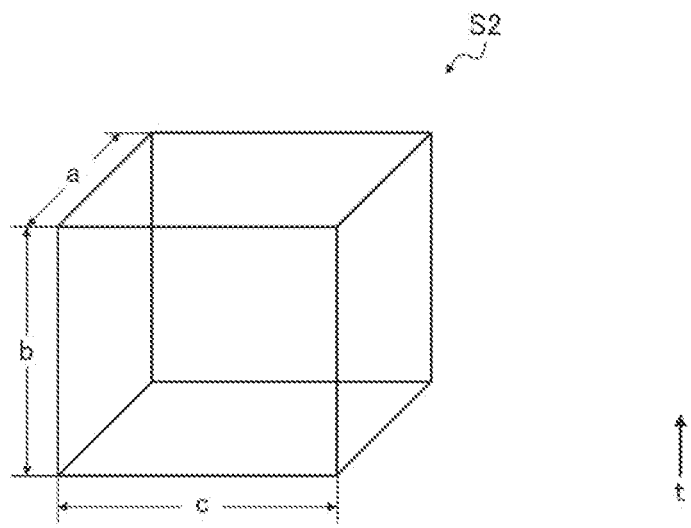
FIG. 5 is a perspective view schematically showing a crystal state corresponding to a (010) plane.
Figure 6:
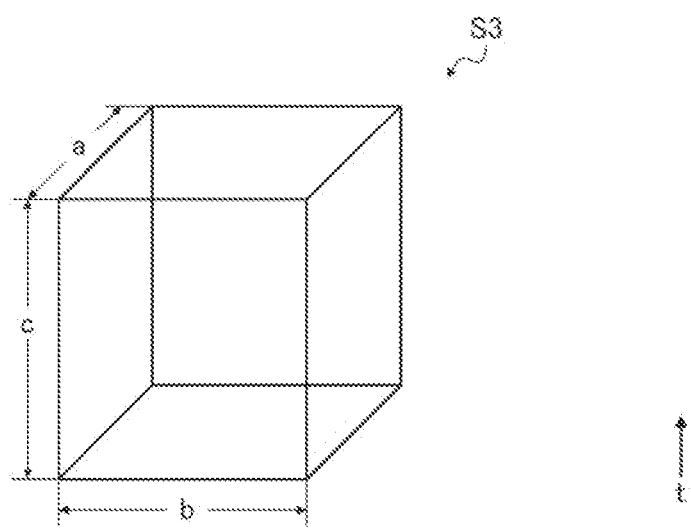
FIG. 6 is a perspective view schematically showing a crystal state corresponding to a (001) plane.

Hereinafter, the crystal state corresponding to the (100) plane is referred to as a first crystal state S1, the crystal state corresponding to the (010) plane is referred to as a second crystal state S2, and the crystal state corresponding to the (001) plane is referred to as a third crystal state S3. FIGS. 4 to 6 schematically show orientation states of crystals exhibiting perovskite structures.

Here, a, b, and c represent lattice constants, and when a<b<c, in the first crystal state S1 corresponding to the (100) plane shown in FIG. 4, a height of a unit lattice in a thickness direction of the piezoelectric layer 30 is a. Further, in the second crystal state S2 corresponding to the (010) plane shown in FIG. 5, a height of a unit lattice in a thickness direction of the piezoelectric layer 30 is b. In the third crystal state S3 corresponding to the (001) plane shown in FIG. 6, a height of a unit lattice in a thickness direction of the piezoelectric layer 30 is c.

Here, the thickness direction is a direction in which layers are laminated on the substrate 10, and is a direction indicated by t in FIGS. 4 to 6.

The X-ray diffraction intensity of the second peak may be larger than the X-ray diffraction intensity of the third peak, and the X-ray diffraction intensity of the first peak may be larger than the X-ray diffraction intensity of the second peak. That is, in the piezoelectric layer 30, the second crystal state S2 corresponding to the (010) plane may be included more than the third crystal state S3 corresponding to the (001) plane, and the first crystal state S1 corresponding to the (100) plane may be included more than the second crystal state S2 corresponding to the (010) plane.

Next, a piezoelectric actuator 100 as an example of a piezoelectric element application device using the piezoelectric element 1 will be described.

The piezoelectric actuator 100 is used, for example, in an inkjet print head of an inkjet printer. Hereinafter, a head 110 as an example of the inkjet print head will be described.

Figure 7:
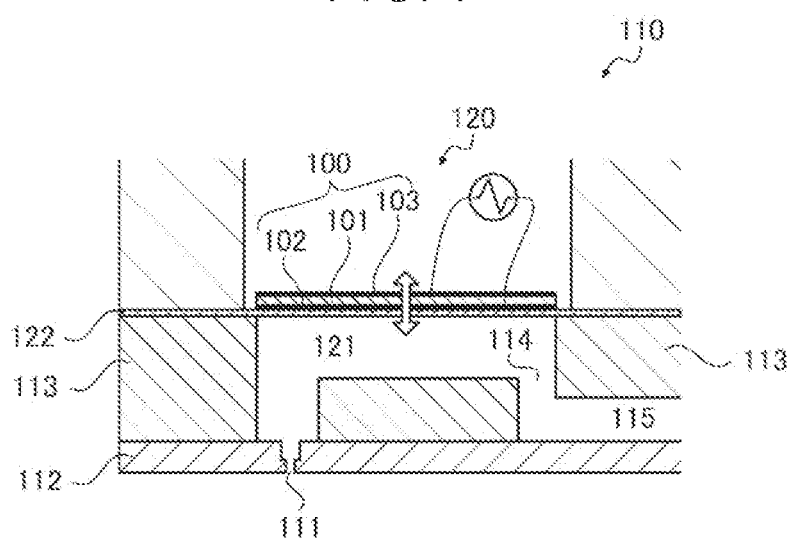
FIG. 7 is a cross-sectional view of a main part of an inkjet print head in which a piezoelectric element application device according to the embodiment of the present disclosure is used.

FIG. 7 is a cross-sectional view of a main part of the head 110, and focuses on one of a plurality of nozzles of the head 110 and conceptually shows a peripheral structure thereof.

The head 110 includes a nozzle 111 for ejecting ink and a pressure generating unit 120 provided so as to correspond to the nozzle 111.

The pressure generating unit 120 includes a cavity 121 that acts as a pressure generating chamber, a diaphragm 122, the piezoelectric actuator 100, or the like.

The cavity 121 communicates with the nozzle 111 and is filled with ink.

The diaphragm 122 has a ceiling surface of the cavity 121, and a volume of the cavity 121, that is, an internal pressure increases or decreases according to bending of the diaphragm 122.

The piezoelectric actuator 100 includes a piezoelectric thin film 101, an electrode 102 provided so as to cover a lower surface of the piezoelectric thin film 101, an electrode 103 provided so as to cover an upper surface of the piezoelectric thin film 101, and the like. The piezoelectric actuator 100 is laminated on the diaphragm 122 so as to sandwich the diaphragm 122 with the cavity 121, and can bend the diaphragm 122 by applying a voltage between the electrode 102 and the electrode 103 to deform the piezoelectric thin film 101.

The nozzle 111 is formed on a nozzle plate 112. Further, a cavity substrate 113 located so as to be sandwiched between the nozzle plate 112 and the diaphragm 122 is formed with the cavity 121 and a reservoir 115 communicating with the cavity 121 via an ink supply port 114. The reservoir 115 communicates with an ink tank via an ink supply path. The ink tank is not shown.

In the piezoelectric actuator 100, the first electrode 20 of the piezoelectric element 1 corresponds to the electrode 102, the piezoelectric layer 30 corresponds to the piezoelectric thin film 101, and the second electrode 40 corresponds to the electrode 103. The substrate 10 of the piezoelectric element 1 is omitted because the diaphragm 122 also serves as the substrate 10.

In the pressure generating unit 120 having such a configuration, by applying a drive signal that changes a voltage level between the electrodes 102 and 103, the diaphragm 122 is bent and vibrated as shown by an arrow in FIG. 7, and therefore a pressure inside the cavity 121 can be changed to vibrate the ink inside the cavity 121 or to eject ink droplets from the nozzle 111.

According to the present embodiment, the following effects can be obtained.

According to the piezoelectric element 1, the piezoelectric layer 30 has the first peak derived from the (100) plane, the second peak derived from the (010) plane, and the third peak derived from the (001) plane in the X-ray diffraction pattern obtained by θ-2θ measurement. That is, the piezoelectric layer 30 has the first crystal state S1 corresponding to the (100) plane, the second crystal state S2 corresponding to the (010) plane, and the third crystal state S3 corresponding to the (001) plane. Therefore, by applying an electric field in the thickness direction of the piezoelectric layer 30 using the first electrode 20 and the second electrode 40, in addition to a displacement from the second crystal state S2 to the third crystal state S3, a displacement from the first crystal state S1 to the third crystal state S3 via the second crystal state S2 can be performed. That is, according to the present piezoelectric element 1, a larger displacement characteristic can be obtained as a piezoelectric characteristic.

Further, by forming the piezoelectric layer 30 by the solution method, a stress generated in the forming stage can be used, and therefore, in the X-ray diffraction pattern obtained by θ-2θ measurement, it is easy to obtain the piezoelectric layer 30 in a crystal state showing three peaks including the first to third peaks. That is, according to the present piezoelectric element 1, the piezoelectric element 1 whose piezoelectric characteristic is improved can be obtained more easily.

Further, according to the piezoelectric element 1, the X-ray diffraction intensity of the first peak derived from the (100) plane is larger than the X-ray diffraction intensity of the third peak derived from the (001) plane. That is, in the piezoelectric layer 30, the first crystal state S1 corresponding to the (100) plane is included more than the third crystal state S3 corresponding to the (001) plane. Since an amount of crystal displaced from the first crystal state S1 to the third crystal state S3 via the second crystal state S2 is relatively large, a larger displacement characteristic can be obtained as the piezoelectric characteristic.

Further, in the piezoelectric element 1, the X-ray diffraction intensity of the second peak derived from the (010) plane may be larger than the X-ray diffraction intensity of the third peak derived from the (001) plane, and the X-ray diffraction intensity of the first peak derived from the (100) plane may be larger than the X-ray diffraction intensity of the second peak derived from the (010) plane. That is, in the piezoelectric layer 30, the second crystal state S2 corresponding to the (010) plane may be included more than the third crystal state S3 corresponding to the (001) plane, and the first crystal state S1 corresponding to the (100) plane may be included more than the second crystal state S2 corresponding to the (010) plane. When an amount of crystal displaced from the second crystal state S2 to the third crystal state S3 is relatively large and the amount of crystal displaced from the first crystal state S1 to the third crystal state S3 via the second crystal state S2 is large, a larger displacement characteristic can be obtained as the piezoelectric characteristic.

Further, according to the piezoelectric element 1, since the piezoelectric layer 30 contains Mn, a decrease in withstand voltage due to crystal defects in the piezoelectric layer 30 is prevented. As a result, the piezoelectric element 1 having a more excellent piezoelectric characteristic can be obtained.

Further, the piezoelectric actuator 100 can be a piezoelectric element application device having further improved characteristics by including the piezoelectric element 1. That is, the piezoelectric actuator 100 can obtain a larger displacement characteristic as the piezoelectric characteristic.

What is claimed is:
1. A piezoelectric element, comprising:
a first electrode;
a second electrode; and
a piezoelectric layer provided between the first electrode and the second electrode, wherein the piezoelectric layer is composed of a composite oxide having a perovskite-type structure and containing potassium, sodium, and niobium, and has a first peak derived from a (100) plane, a second peak derived from a (010) plane, and a third peak derived from a (001) plane in an X-ray diffraction pattern obtained by θ-2θ measurement, and an X-ray diffraction intensity of the first peak is larger than an X-ray diffraction intensity of the third peak, and wherein an X-ray diffraction intensity of the second peak is larger than the X-ray diffraction intensity of the third peak, and the X-ray diffraction intensity of the first peak is larger than the X-ray diffraction intensity of the second peak.

2. The piezoelectric element according to claim 1, wherein
the piezoelectric layer is formed by a solution method.

3. The piezoelectric element according to claim 1, wherein
the piezoelectric layer contains Mn.

4. A piezoelectric element application device comprising the piezoelectric element according to claim 1.

* * * * *